(12) United States Patent
Kohler

(10) Patent No.: US 6,380,016 B2
(45) Date of Patent: *Apr. 30, 2002

(54) METHOD FOR FORMING PROGRAMMABLE CMOS ROM DEVICES

(76) Inventor: Ross Alan Kohler, 107 Aspen Dr., Allentown, PA (US) 18104

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,095

(22) Filed: Jun. 23, 1998

(51) Int. Cl.[7] .......................................... H01L 26/8238
(52) U.S. Cl. ........................ 438/200; 438/130; 438/276
(58) Field of Search ................................ 438/278, 275, 438/279, 276, 306, 201, 199, 200, 219, 224, 223, 227, 228, 229, 230, 231, 232, 268, 130; 257/369

(56) References Cited

U.S. PATENT DOCUMENTS

| | | | | |
|---|---|---|---|---|
| 4,683,641 A | * | 8/1987 | Ravindhran et al. | 438/130 |
| 5,091,329 A | * | 2/1992 | Bekkering et al. | 438/130 |
| 5,322,809 A | * | 6/1994 | Moslehi | 438/303 |
| 5,550,072 A | * | 8/1996 | Cacharelis et al. | 438/201 |
| 5,640,037 A | * | 6/1997 | Blanchard | 257/369 |
| 5,663,080 A | * | 9/1997 | Cereda et al. | 438/450 |
| 5,972,762 A | * | 10/1999 | Wu | 438/205 |
| 5,981,324 A | * | 11/1999 | Seo et al. | 438/210 |

FOREIGN PATENT DOCUMENTS

EP        0575688      * 10/1992     ......... H01L/27/112

\* cited by examiner

*Primary Examiner*—Charles Bowers
*Assistant Examiner*—Brook Kebede
(74) *Attorney, Agent, or Firm*—Peter V. D. Wilde; Thomas, Kayden, Horstemeyer & Risley LLP

(57) ABSTRACT

The specification describes a CMOS compatible technique for programming MOS ROM devices. The technique involves doping the polysilicon gates of selected ROM devices with impurities having a type complementary to the channel, thereby raising the threshold voltage of those selected devices to a value above the operating voltage of the memory array. The programming step can be performed at the same time the CMOS gates are complementary doped thus allowing the ROM array to be programmed without additional processing steps.

10 Claims, 3 Drawing Sheets

US 6,380,016 B2

METHOD FOR FORMING PROGRAMMABLE CMOS ROM DEVICES

FIELD OF THE INVENTION

The invention relates to read-only memories (ROMs) and to methods for their manufacture.

BACKGROUND OF THE INVENTION

Semiconductor read-only memories have been implemented in a variety of forms most of which are variations of the traditional insulated gate field effect transistor structure. These memories comprise arrays of MOS transistors which, when read, produce a pre-programmed binary code. In the simplest form, these devices are programmed by permanently turning off selected transistors in the array. A variety of approaches have been used for turning off selected devices in the array. A common approach is to eliminate an essential device feature in the selected transistors during manufacture of the array. Thus polysilicon gates can be left out for the selected devices in the course of patterning the polysilicon layer. The source and drain can be omitted in the step of opening source/drain windows. Selected devices can also be eliminated during metallization. In another embodiment, the threshold voltage of selected devices is adjusted using a threshold adjusting implant. This approach has been successful, and is widely used in the industry. However, it typically involves an added implant step.

A typical ROM device consists of a memory array, usually of NMOS devices, with CMOS devices for the drive, logic and sense circuits.

Consequently the overall technology used in ROMs, as in DRAMs, is CMOS technology. Thus it is important that new developments in ROM device design be compatible with CMOS processing.

STATEMENT OF THE INVENTION

I have developed a new approach to programming ROM devices in a CMOS memory device. According to my invention, the steps used for complementary doping of the polysilicon gate layer are also used to program the ROM devices in the memory array. By doping selected MOS gates in the ROM array with doping complementary to the doping of the device channel, the threshold voltage of those selected devices is driven substantially higher, and the selected devices are effectively turned off. In this way the ROM devices can be programmed without added process steps.

DETAILED DESCRIPTION

Figure 1:
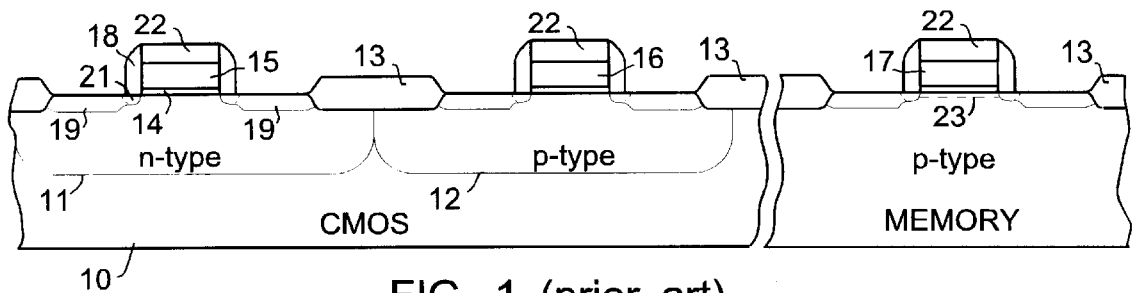
FIG. 1 is a schematic representation of a conventional ROM device showing a CMOS transistor pair from the CMOS circuit and an MOS memory device adapted to be programmed using a threshold implant.

With reference to FIG. 1, a portion of a basic silicon gate CMOS ROM device is shown with the CMOS structure to the left in the figure and a selected MOS transistor of the memory array shown at the right. The substrate 10 is common to both devices and is split to indicate that different portions of a large chip are being illustrated. The memory device in the most typical case is an n-channel or NMOS transistor. While an n-channel transistor is shown it will be appreciated by those skilled in the art that a p-channel or PMOS device could also be represented. (It will be understood that no attempt has been made to draw the elements in these Figures to scale.)

In FIG. 1 the substrate shown at 10, the n-type tub shown at 11, the p-type tub shown at 12, the field oxide shown at 13, the gate dielectric shown at 14, the polysilicon gate 15 for the p-channel CMOS transistor, the polysilicon gate 16 for the n-channel CMOS transistor, the polysilicon gate 17 for the n-channel ROM transistor, the sidewall spacers shown at 18, the source drain implants 19, and the lightly doped drains 21, are standard structural features in silicon IC technology. (Elements 14 and 18,19,21 and 22 are common to all three MOS devices but have been shown on only one device for clarity).

A wide variety device structures are used in ROM technology and the one shown is schematic and representative of the variety of choices. The common feature of these ROM devices which is relevant to this invention is the control gate 17 for reading the on-off state of the device.

The gate dielectric 14 is grown $SiO_2$ with a typical thickness of the order of 20 to 200 Angstroms. The poly layer for the gates 15–17 is typically CVD deposited polysilicon of the order of 500–1000 nm in thickness. FIG. 1 also shows a cladding layer 22 deposited over the polysilicon layer to reduce interdiffusion as will be described in detail later. Also shown in FIG. 1 is a channel implant 23 which is used for programming the ROM device as will be discussed below. Channel implants (not shown) may also be performed on the CMOS transistors to adjust the transistor threshold.

Figure 2:
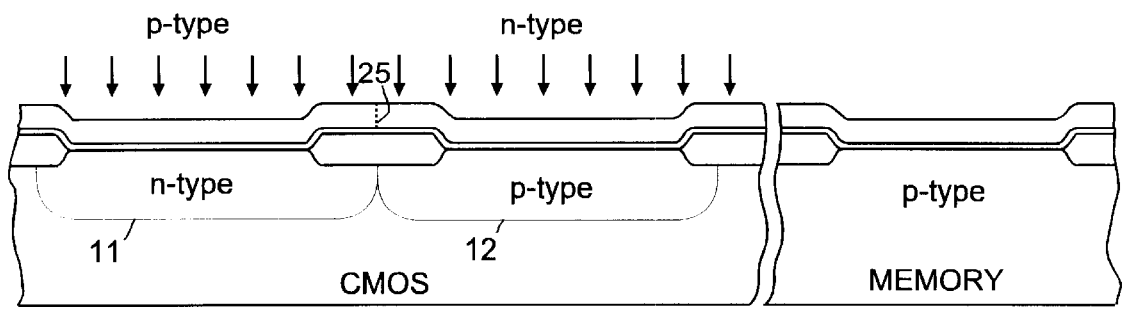
FIG. 2 is a schematic representation of the step of complementary doping the polysilicon gates of the CMOS devices.

As described above, and shown in FIG. 2, the poly gate layer over the CMOS devices is degeneratively doped to decrease sheet resistance and eliminate depletion effects. To better illustrate the complementary doping step for the CMOS devices it is helpful to view two CMOS devices and to view them along the length of the gate of FIG. 1. FIG. 2 shows two complementary MOS devices with gates serially connected. The device in the n-type tub 11 is destined to be a p-channel device with p-doping, indicated by the arrows, for the portion of the polysilicon gate that serves this device. The device in the p-tub 12 will be an n-channel device with n-type doping for those portions of the polysilicon level that form gates for n-channel devices. The usual practice is to dope the polysilicon gate layer which overlies the n-channel devices with arsenic to render it n-type and the polysilicon gate layer which overlies the p-channel devices with boron. This complementary doping of the polysilicon gate layer is designed to match the work functions of the gates to those of the transistor channels and has been found to be helpful to the ultimate device performance. However, the high diffusion propensity of dopants in polysilicon results in significant lateral movement of the impurities during subsequent processing steps, notably the source/drain implant drive steps and process anneals. Under typical processing conditions the dopants will interdiffuse to an extent which reduces and even eliminates the objective of complementary doping.

Various techniques have been proposed to avoid lateral diffusion, including attempts at reducing thermal processing of the wafer. However, the most effective remedy to date is the use of a cladding layer deposited over the polysilicon gate after the complementary doping implant step. It has been found that the presence of the cladding layer reduces the tendency of the dopants to diffuse laterally and maintains the desired complementary doping profiles. The cladding layer is shown at 22 in FIG. 1 on the CMOS transistor gates 15, 16 and the memory gates 17. A significant added advantage of the cladding layer is that it shunts the p-n junction, shown at 25 in FIG. 2, formed at the interface between the complementary doped regions of the gate poly layer. The cladding layer typically has a thickness comparable to the thickness of the poly layers.

In a typical ROM chip fabrication process, the channels of selected transistors in the memory array are implanted to adjust the transistor threshold prior to depositing the polysilicon gate layer. The threshold implant for the selected ROM transistor is represented at 23 in FIG. 1. Channel implants (not shown) may also be performed on the CMOS transistors. The threshold implant for the selected ROM transistor is heavily n-type if the transistor is programmed as always on, or heavily p-type if the transistor is programmed as always off.

Figure 3:
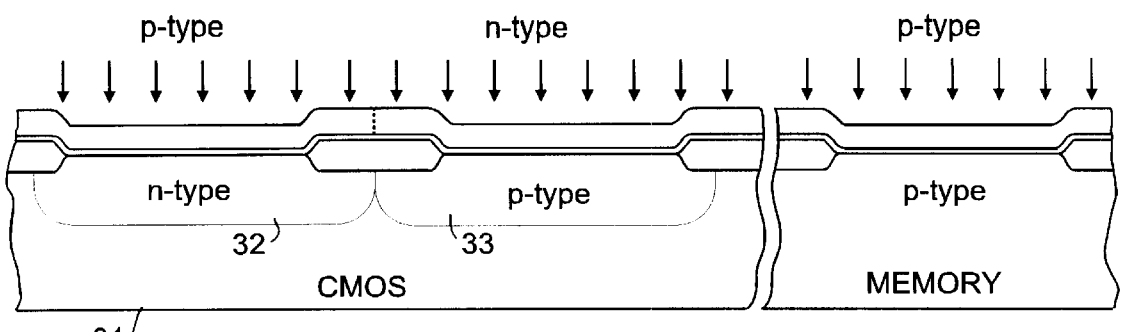
FIG. 3 is a schematic representation, similar to FIG. 2, of the step of complementary doping the polysilicon gates of the CMOS devices and encoding the ROM array in the same operation.

The ROM programming technique of the invention is represented in FIG. 3 wherein the polysilicon gate of the selected ROM device is doped complementary to the channel doping. (The term channel doping in this context refers to the induced channel and is the same type as the source and drain.) This creates a large disparity in work function between gate and the channel, and results in a change in threshold voltage sufficient for the circuit to discriminate between the two coded states of the cell. The polysilicon gates of non-selected devices in the memory array are masked against this implant, but receive the normal n-type implant and thus retain a normal turn-on voltage. The implantation step used for programming the n-channel memory array in this manner is the same step used to dope the CMOS polysilicon gates, as shown in FIG. 2. Thus it will be appreciated by those skilled in the art, that no process steps have been added to program the ROM array, and the threshold implant step formerly used to program the memory has been eliminated.

The overall process sequence will be described with reference to FIGS. 4–10. In this description, as well as in the description of FIGS. 1–3, various conventional device elements and conventional processing steps have been omitted for simplicity. For example, it will be understood that the structures shown are completed with the usual deposited interlevel dielectrics, multiple patterned metal interconnect levels, and passivating layer. It is also understood that only a portion of the overall device is shown to illustrate the inventive contribution. Likewise in the processing sequence about to be described, conventional steps for preparing the substrate, e.g. cleaning, CMOS tub formation, field oxide growth, etc., are within the skill of the art and need not be described in detail. The description is directed mainly at the channel area of the devices and particularly the gate structures.

Figure 4:
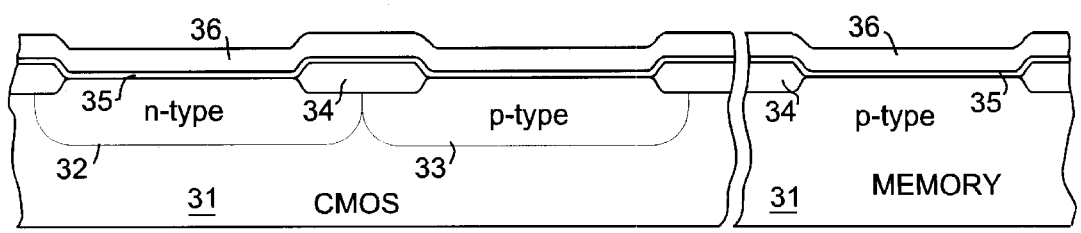
FIGS. 4–10 are illustrations of process steps used in the fabrication of the ROM device according to the invention.

In FIGS. 4–10, as in FIGS. 1–3, the CMOS portion of the device is shown at the left and a selected one of the ROM memory devices to the right. The non-selected ROM devices are not shown for simplicity in the illustration but as recognized by those skilled in the art the non-selected devices will receive standard processing, e.g., the gate implant for the non-selected devices is the normal n-type implant. All devices are contained in common substrate 31. With reference to FIG. 4, the CMOS portion comprises n-tub 32 and p-tub 33. The standard field oxide is shown at 34.

After growth of the field oxide, the transistor channels may be implanted with a conventional threshold adjusting implant. The gate dielectric 35 is grown to a thickness of 40–60 Angstroms, over p-type silicon substrate 31. Gate polysilicon layer 36 is deposited by e.g. CVD at 550° C. to a thickness of 500–2000 Angstroms.

Figure 5:
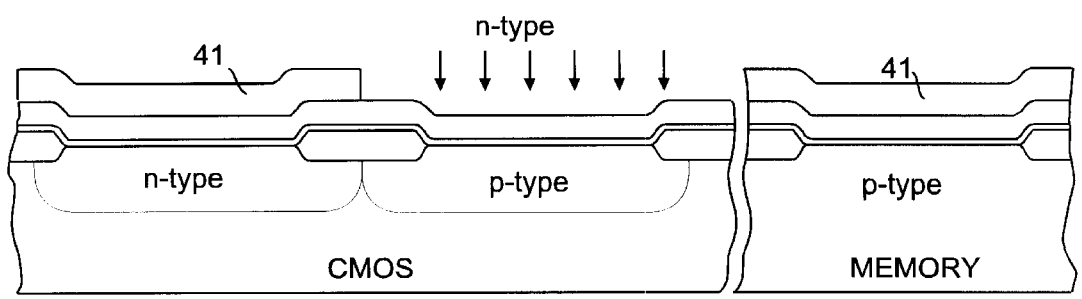

FIG. 5 illustrates the complementary doping of the polysilicon layer 36. A conventional implant mask 41 is lithographically applied to mask the p-channel CMOS device regions of the polysilicon layer as shown. It is also applied to mask the polysilicon gate region for the selected ROM device. The gates of the non-selected ROM devices (not shown) are exposed to this implant. The mask is typically a photomask patterned with UV light. Alternatively the mask can be exposed with e-beam or x-ray actinic radiation. The implanted ions are typically arsenic, although phosphorus can also be used. The doses are typically high, e.g. in the range 1e15 to 1e16 for arsenic.

Figure 6:
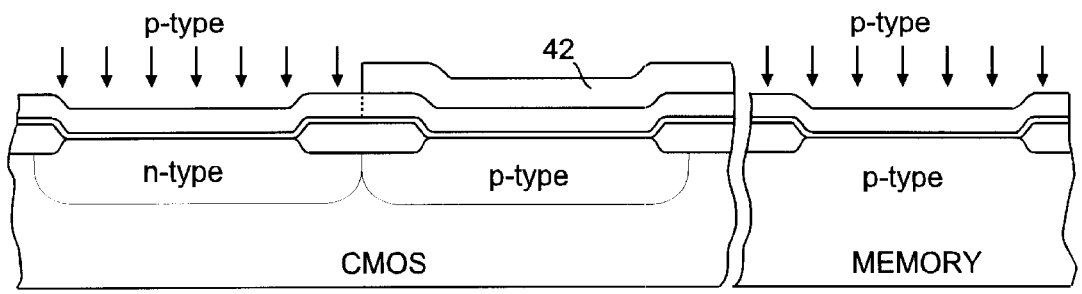

The complementary mask 42, shown in FIG. 6, is then applied to mask the n-channel CMOS devices and dope the polysilicon gates for the p-channel devices. The usual dopant is boron, and again the doses are high, e.g. 1e15 to 1e16. In the conventional prior art process for ROM manufacture, the n-channel memory devices are masked against the boron implant. However, according to the invention, the gate regions for selected transistors in the n-channel memory array are deliberately exposed to the p-type implant to increase the threshold voltage for these devices to a level where they will remain off when other transistors in the n-channel memory array are switched on. The dose used for the polygate regions for the n-channel transistors is suitable for this adjustment. Thus, the only change in the process of the invention is the mask pattern for the n-type and p-type polysilicon gate implants. No steps are added. The threshold implant described above for programming the ROM array is eliminated in this process.

Figure 7:
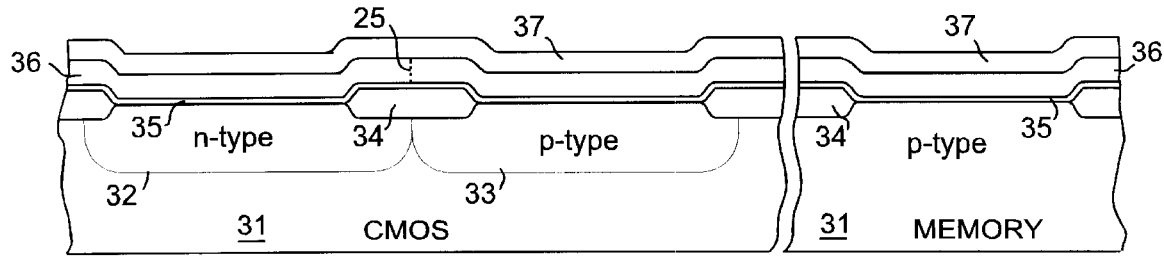

According to a preferred embodiment of the invention, a cladding layer 37 is then deposited over the entire structure as shown in FIG. 7. The cladding layer is preferably TiN and may be deposited by known techniques, e.g. sputtering from a TiN cathode. The layer may be of the order of 100–1000 nm in thickness. Alternatively, the cladding layer may be selected from a variety of refractory metals, metal alloys and metallic compounds, e.g. silcides. Examples of such materials are tungsten, tantalum, titanium, chromium, tantalum nitride, cobalt silicide, tantalum silicide, titanium silicide. Salicide techniques may also be found useful in forming a silicide layer on the polysilicon gates.

Figure 8:
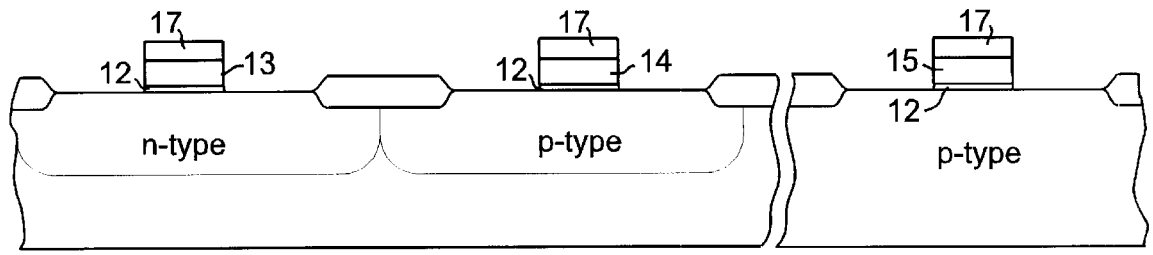

The structure shown in FIG. 8 is a view of the structure in the same orientation as in FIG. 1, i.e. normal to that in FIGS. 4–7. The polysilicon gate layer, or the cladding layer if a cladding layer is used, is then masked with a lithographic mask and the gate stack is defined by conventional plasma etching. If a thick cladding layer is used, the etch required to pattern the gate stack may be severe in which case a hard mask, i.e. an oxide mask, may be used.

Figure 9:
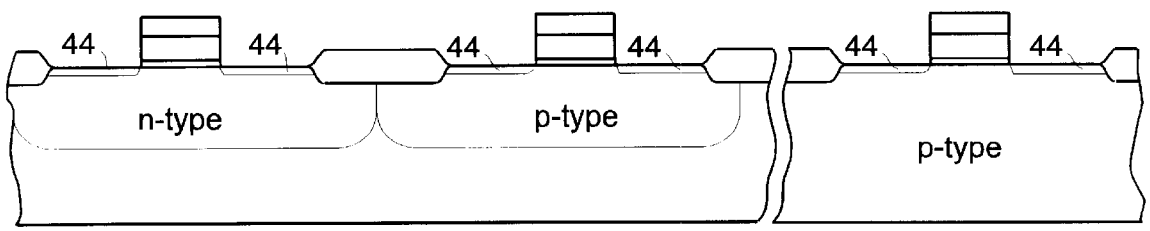
Figure 10:
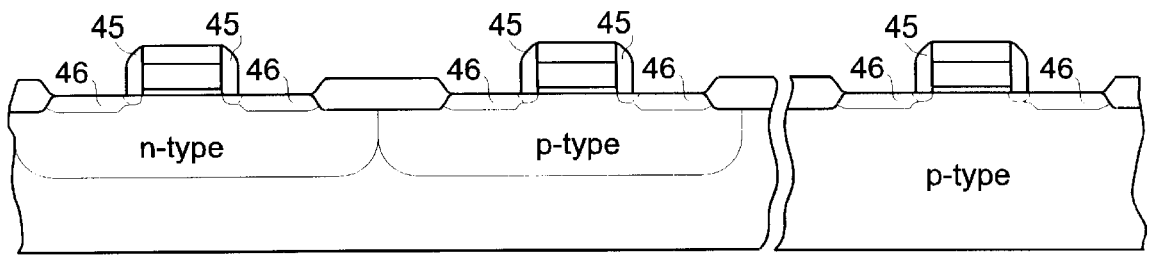

The source and drain regions are then formed by a first shallow implant 44, shown in FIG. 9, followed by the formation of sidewall spacers 45 shown in FIG. 10, and a heavier, deeper implant 46 to complete the typical LDD structure. The gate stack structure of FIG. 8 shows the gate stack layers etched through to the substrate for source/drain implants into the bare silicon substrate. Alternatively, the gate oxide can be retained and source/drain implants made through the gate oxide layer.

The remaining steps required to finish the device, i.e. oxide deposition, contact hole formation, and metallization are standard operations that are omitted for brevity.

In programming the ROM array, the doping level required to achieve the desired permanent switched state will depend on a variety of factors, e.g. the read voltage for the device, the margin desired for error, the channel doping, the thickness of the gate oxide, etc. For purposes of the invention, an operative minimum doping level can be defined as the level that changes the threshold voltage of a selected ROM device by at least 25%. The change in the threshold voltage is intended to mean the difference between the threshold voltage of a ROM device with a gate doped complementary to the channel in accordance with the technique of the invention as compared with a ROM device with a gate that is not doped complementary to the channel.

It will be understood by those skilled in the art that the memory array in the devices described herein is an n-channel array but could also be a p-channel array. In that case the mask for doping the polysilicon gates of the n-channel devices in the CMOS section of the IC would be used to turn off selected devices in the p-channel memory array.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. Method for the manufacture of integrated circuits comprising the steps of:
   a. growing a gate dielectric layer on a silicon substrate,
   b. depositing a polysilicon layer over the gate dielectric layer, and polysilicon layer having:
      i. a plurality of first gate regions for n-channel CMOS transistors,
      ii. a plurality of second gate regions for p-channel CMOS transistors each of said plurality of second gate regions connected to one of said plurality of first gate regions,
      iii. a plurality of ROM gate regions for n-channel ROM devices, said plurality of ROM gate regions having a first group of ROM gate regions to be programmed on and a second group of ROM gate regions to be programmed off,
   c. masking said second gate regions with an implant mask leaving said first gate regions exposed,
   d. implanting n-type impurities into said first gate regions,
   e. masking said first gate regions with an implant mask, leaving said second gate regions exposed, and said second group of ROM gate regions exposed,
   f. simultaneously implanting p-type impurities into said second gate regions, and into said second group of ROM gate regions,
   g. masking said first plurality of gate regions, said second plurality of gate regions, and said plurality of ROM gate regions of said polysilicon layer with an etch mask,
   h. etching said polysilicon layer using said etch mask to form p-channel CMOS gates, n-channel CMOS gates and ROM gates, and thereafter:
   j. implanting into the silicon substrate:
      i. n-type impurities adjacent the first gate regions to form sources and drains for the n-channel CMOS transistors,
      ii. p-type impurities adjacent the second gate regions to form sources and drains for the p-channel CMOS transistors,
      iii. n-type impurities adjacent the first group of ROM gate regions to form sources and drains for the n-channel ROM devices.

2. The method of claim 1 in which the p-type impurities implanted into said ROM gate regions have a concentration sufficient to increase the threshold voltage of said ROM device by at least 25%.

3. The integrated circuit of claim 1 further including a cladding layer covering said first gate regions and said second gate regions.

4. The integrated circuit of claim 3 wherein the cladding layer is selected from the group consisting of TiN, TaN, TiSi, CoSi, WSi, W, Ti, and Ta.

5. The integrated circuit of claim 4 wherein the cladding layer is TiN.

6. Method for the manufacture of integrated circuits comprising the steps of:
   a. growing a gate dielectric layer on a silicon substrate,
   b. depositing a polysilicon layer over the gate dielectric layer, said polysilicon layer having:
      i. a plurality of first gate regions for n-channel CMOS transistors,
      ii. a plurality of second gate regions for p-channel CMOS transistors each of said plurality of second gate regions connected to one of said plurality of first gate regions,
      iii. a plurality of ROM gate regions for p-channel ROM devices, said plurality of ROM gate regions having a first group of ROM gate regions to be programmed on and a second group of ROM gate regions to be programmed off,
   c. masking said second gate regions with an implant mask and masking said first group of ROM gate regions with an implant mask leaving said first gate regions exposed and said second group of ROM gate regions exposed,
   d. simultaneously implanting n-type impurities into said first gate regions, and into said second group of ROM gate regions,
   e. masking said first gate regions with an implant mask, leaving said second gate regions exposed,
   f. implanting p-type impurities into said second gate regions,
   g. masking said first plurality of gate regions, said second plurality of gate regions, and said plurality of ROM gate regions of said polysilicon layer with an etch mask,
   h. etching said polysilicon layer using said etch mask to form p-channel CMOS gates, n-channel CMOS gates and ROM gates, and thereafter:
   j. implanting into the silicon substrate:
      i. n-type impurities adjacent the first gate regions to form sources and drains for the n-channel CMOS transistors,
      ii. p-type impurities adjacent the second gate regions to form sources and drains for the p-channel CMOS transistors,
      iii. p-type impurities adjacent the first group of ROM gate regions to form sources and drains for the p-channel ROM devices.

7. The method of claim 6 in which the p-type impurities implanted into said ROM gate regions have a concentration sufficient to increase the threshold voltage of said ROM device by at least 25%.

8. The integrated circuit of claim 6 further including a cladding layer covering said first gate regions and said second gate regions.

9. The integrated circuit of claim 8 wherein the cladding layer is selected from the group consisting of TiN, TaN, TiSi, CoSi, WSi, W, Ti, and Ta.

10. The integrated circuit of claim 9 wherein the cladding layer is TiN.

* * * * *